(12) United States Patent
Cheng et al.

(10) Patent No.: US 12,184,003 B2
(45) Date of Patent: Dec. 31, 2024

(54) ELECTRICAL CONNECTOR WITH TWO CIRCUIT BOARDS MOUNTED IN A TWO-PART HOUSING WITH SUPPORT STRUCTURES AND ASSEMBLING METHOD THEREOF

(71) Applicant: JESS-LINK PRODUCTS CO., LTD., New Taipei (TW)

(72) Inventors: Chieh-Ming Cheng, New Taipei (TW); Hsu-Feng Chang, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 338 days.

(21) Appl. No.: 17/735,527

(22) Filed: May 3, 2022

(65) Prior Publication Data

US 2023/0299521 A1 Sep. 21, 2023

(30) Foreign Application Priority Data

Mar. 17, 2022 (TW) .................................. 111109911

(51) Int. Cl.
| | |
|---|---|
| *H01R 12/72* | (2011.01) |
| *H01R 13/502* | (2006.01) |
| *H01R 13/518* | (2006.01) |
| *H01R 13/629* | (2006.01) |
| *H05K 1/14* | (2006.01) |
| *H01R 13/46* | (2006.01) |
| *H01R 13/506* | (2006.01) |

(Continued)

(52) U.S. Cl.
CPC ........... *H01R 12/72* (2013.01); *H01R 13/502* (2013.01); *H01R 13/518* (2013.01); *H01R 13/629* (2013.01); *H05K 1/144* (2013.01); *H01R 13/46* (2013.01); *H01R 13/506* (2013.01); *H01R 13/516* (2013.01); *H01R 13/52* (2013.01); *H01R 13/5202* (2013.01); *H01R 13/5205* (2013.01); *H01R 13/5213* (2013.01); *H01R 13/6658* (2013.01); *H05K 1/14* (2013.01)

(58) Field of Classification Search
CPC .... H01R 12/72; H01R 13/502; H01R 13/518; H01R 13/629; H01R 13/46; H01R 13/506; H01R 13/516; H01R 13/52; H01R 13/5202; H01R 13/5205; H01R 13/5213; H01R 13/6658; H05K 1/144; H05K 1/14
See application file for complete search history.

(56) References Cited

FOREIGN PATENT DOCUMENTS

| | | | | |
|---|---|---|---|---|
| CN | 103943982 A | * | 7/2014 | ........... H01R 12/523 |
| CN | 108666822 A | * | 10/2018 | ........... H01R 13/436 |

* cited by examiner

*Primary Examiner* — Justin M Kratt
(74) *Attorney, Agent, or Firm* — Chun-Ming Shih; HDLS IPR SERVICES

(57) ABSTRACT

An electrical connector includes a casing, and a first and a second circuit boards. The casing has a bottom shell and a cover. The bottom shell has an inner bottom surface and an open top. A first carrying platform and a second carrying platform protruded from the inner bottom surface. The cover has an inner top surface facing the inner bottom surface. A first and a second holder blocks are protruded from the inner top surface. The first circuit board is carried on the first carrying platform and clamped between the first carrying platform and the first holder block. The second circuit board is carried on the second carrying platform, stacked on the first circuit board, and clamped between the second carrying platform and the second holder block. The second circuit board has an opening for the first holder block to pass.

15 Claims, 10 Drawing Sheets

(51) Int. Cl.
*H01R 13/516* (2006.01)
*H01R 13/52* (2006.01)
*H01R 13/66* (2006.01)

ELECTRICAL CONNECTOR WITH TWO CIRCUIT BOARDS MOUNTED IN A TWO-PART HOUSING WITH SUPPORT STRUCTURES AND ASSEMBLING METHOD THEREOF

BACKGROUND OF THE DISCLOSURE

Technical Field

The technical field relates to an electrical connector, and more particularly relates to a dual board electrical connector.

Description of Related Art

A related-art dual board electrical connector has two circuit boards installed in its casing, and the two sides of each circuit board need to be suspended for docking. In the related-art dual board electrical connector, the casing is generally divided into a pair of symmetrical half shells. When assembled, each circuit board is installed into each half shell separately and then the two half shells are combined with each other. When the circuit board is installed into the half shell, the circuit board has not been positioned, so that it is necessary to align the two circuit boards while aligning and assembling the two half shells, and one of the half shells needs to be installed upside down, and thus the circuit board in such half shell may fall off easily. The related-art dual board electrical connector has the drawbacks of poor component positioning and inconvenient assembling.

In view of the aforementioned drawbacks, the discloser proposed this disclosure based on his expert knowledge and elaborated researches to overcome the drawbacks of the related art.

SUMMARY OF THE DISCLOSURE

This disclosure is directed to a dual board electrical connector.

The disclosure provides an electrical connector, which includes a casing, a first circuit board and a second circuit board. The casing includes a bottom shell and a cover, and the bottom shell has an inner bottom surface and an open top, and the inner bottom surface has a first carrying platform and a second carrying platform protruded therefrom, and the cover has an inner top surface for covering and closing the top of the bottom shell, such that the inner top surface and the inner bottom surface are configured to be opposite to each other, and the inner top surface has a first holder block and a second holder block protruded therefrom. The first circuit board is carried on the first carrying platform and clamped between first carrying platform and first holder block. The second circuit board is carried on the second carrying platform, stacked on the first circuit board, and clamped between the second carrying platform and the second holder block. The second circuit board has an opening, and the first holder block passes through the opening.

In the electrical connector of this disclosure, the inner bottom surface has an auxiliary carrying platform protruded therefrom, and the casing is in a rectangular shape, and the first carrying platform is disposed corresponding to the center of the first circuit board in a longitudinal direction of the casing, and the auxiliary carrying platform supports the second circuit board. The inner top surface has an auxiliary holder block protruded therefrom, and the second circuit board is clamped between the auxiliary carrying platform and the auxiliary holder block.

In the electrical connector of this disclosure, the inner bottom surface has an auxiliary carrying platform protruded therefrom, and the casing is in a rectangular shape, and the second carrying platform is disposed corresponding to the center of the second circuit board in a longitudinal direction of the casing, and the auxiliary carrying platform supports the first circuit board. The inner top surface has an auxiliary holder block protruded therefrom, and the first circuit board is clamped between the auxiliary carrying platform and the auxiliary holder block.

In the electrical connector of this disclosure, the bottom shell has a first positioning pin protruded therefrom, and the first circuit board has a first positioning notch, and the first positioning pin is inserted in the first positioning notch. The first positioning pin is disposed on the top of the first carrying platform.

In the electrical connector of this disclosure, the bottom shell has a second positioning pin protruded therefrom, and the second circuit board has a second positioning notch, and the second positioning pin is inserted in the second positioning notch. The second positioning pin is installed on the top of the second carrying platform.

The electrical connector of this disclosure further includes a first insulation base and a second insulation base, and the first circuit board is embedded in the first insulation base, and the second circuit board is embedded in the second insulation base, and the first insulation base and the second insulation base are engaged with each other.

This disclosure further provides an assembling method of an electrical connector. The method includes the steps of: providing a bottom shell, a cover, a first circuit board and a second circuit board, wherein the bottom shell has an inner bottom surface and an open top, and the inner bottom surface has a first carrying platform and a second carrying platform protruded therefrom, and the cover has an inner top surface, and the inner top surface has a first holder block and a second holder block protruded therefrom, and second circuit board has an opening; putting the first circuit board into the bottom shell to be located on the first carrying platform; putting the second circuit board into the bottom shell to be located on the second carrying platform and stacked on the first circuit board; covering and closing the top of the bottom shell by the cover and passing the first holder block through the opening, and clamping the first circuit board by using the first carrying platform and the first holder block, and clamping the second circuit board by the second carrying platform and the second holder block.

In the assembling method in accordance with this disclosure, the bottom shell has a first positioning pin protruded therefrom, and the first circuit board has a first positioning notch, and the first positioning pin is inserted into the first positioning notch to position the first circuit board. The bottom shell has a second positioning pin protruded therefrom, and the second circuit board has a second positioning notch, and the second positioning pin is inserted into the second positioning notch to position the second circuit board.

In the electrical connector of this disclosure, both of the first carrying platform and the second carrying platform are disposed on the bottom shell, so as to facilitate assembling the first circuit board and the second circuit board to the bottom shell one by one, without the need of positioning the first circuit board and the second circuit board relative to each other. The second circuit board has an opening for passing the first holder block, so that when the cover is installed, the first circuit board and the second circuit board are fixed at the same time.

DETAILED DESCRIPTION

Figure 1:
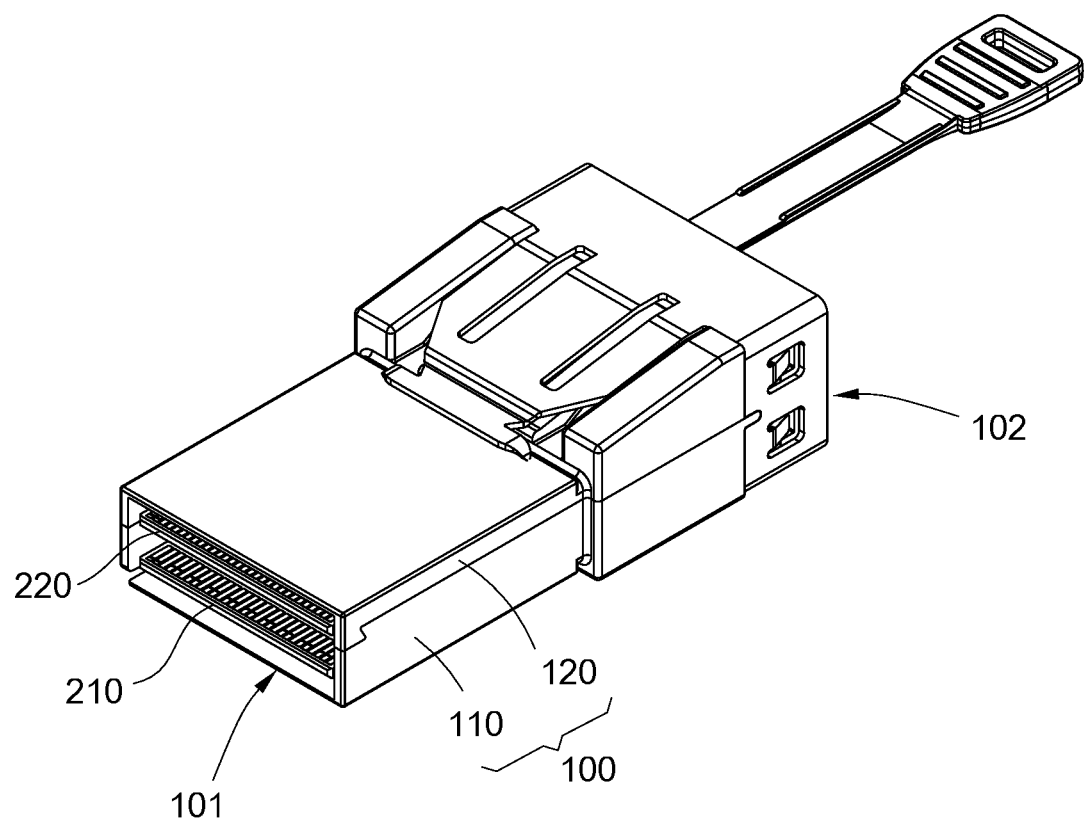
FIG. 1 is a perspective view of an electrical connector in accordance with some embodiments of this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

With reference to FIGS. 1 to 4 for an electrical connector in accordance with some embodiments of this disclosure, the electrical connector includes a casing 100, a first circuit board 210, and a second circuit board 220.

The casing 100 is in a rectangular shape, and two ends of the casing 100 are defined as a plug end 101 and a wire outlet end 102 respectively. The plug end 101 is open and the wire outlet end 102 is closed by a waterproof plug 103. The casing 100 includes a bottom shell 110 and a cover 120, and the bottom shell 110 has an inner bottom surface 111 and an open top, and the cover 120 has an inner top surface 121 and is provided for covering and closing the top of the bottom shell 110, such that the inner top surface 121 and the inner bottom surface 111 are configured to be opposite to each other. The inner bottom surface 111 has a first carrying platform 131 and a second carrying platform 132 protruded therefrom, and the inner top surface 121 has a first holder block 141 configured to be corresponding to the first carrying platform 131 and a second holder block 142 configured to be corresponding to the second carrying platform 132. The bottom shell 110 has a first positioning pin 151 and a second positioning pin 152 protruded therefrom. Specifically, the first positioning pin 151 is disposed on the top of the first carrying platform 131 and the second positioning pin 152 is disposed on the top of the second carrying platform 132.

With reference to FIGS. 2 and 5 to 11, the first circuit board 210 is contained in the casing 100, and a part of the first circuit board 210 is exposed from the plug end 101 and provided for engaging another corresponding electrical connector, and the first circuit board 210 is soldered with a lead wire 201, and the lead wire 201 passes through the waterproof plug 103 and passes from the wire outlet end 102 to be exposed out of the casing 100. The first circuit board 210 is carried on the first carrying platform 131 and clamped between the first carrying platform 131 and the first holder block 141, so as to position the first circuit board 210 in a direction perpendicular to the first circuit board 210. The first circuit board 210 has a first positioning notch 211 which is a notch formed at an edge of the first circuit board 210 in this embodiment, but this disclosure is not limited to such arrangement only. For example, the first positioning notch 211 may be a through hole. The first positioning pin 151 passes into the first positioning notch 211, such that the first circuit board 210 is positioned on a plane where the first circuit board 210 is situated.

The second circuit board 220 is contained in the casing 100, and a part of the second circuit board 220 is exposed from the plug end 101 and provided for engaging another corresponding electrical connector, and the second circuit board 220 is soldered with a lead wire 202, and the lead wire 202 passes through the waterproof plug 103 and passes from the wire outlet end 102 to be exposed out of the casing 100. The second circuit board 220 is carried on the second carrying platform 132 and stacked on the first circuit board 210. The second circuit board 220 has an opening 222 which is a notch formed at an edge of the second circuit board 220 in this embodiment, but this disclosure is not limited to such arrangement only. For example, the opening 222 may be a through hole. The first holder block 141 passes through the opening 222, and the second circuit board 220 is clamped between the second carrying platform 132 and the second holder block 142, such that the second circuit board 220 is positioned perpendicularly. The second circuit board 220 has a second positioning notch 221 which is a notch formed at an edge of the second circuit board 220 in this embodiment, but this disclosure is not limited to such arrangement only. For example, the second positioning notch 221 may be a through hole. The second positioning pin 152 passes into the second positioning notch 221, such that the second circuit board 220 is positioned on a plane where the second circuit board 220 is situated.

The electrical connector of this disclosure further includes a first insulation base 310 and a second insulation base 320, and the first circuit board 210 is embedded in the first insulation base 310 and the first insulation base 310 covers the connection position of the lead wire 201 on the first circuit board 210, and the second circuit board 220 is embedded in the second insulation base 320 and the second insulation base 320 covers the connecting position of the lead wire 202 on the second circuit board 220, and both of the first insulation base 310 and second insulation base 320 are engaged with each other to facilitate assembling the first circuit board 210 and the second circuit board 220.

In the longitudinal direction of the casing 100, if the first carrying platform 131 supports at the center of the first circuit board 210, then the second carrying platform 132 supports on a side of the second circuit board 220. On the other hand, if the second carrying platform 132 supports at the center of the second circuit board 220, then the first carrying platform 131 supports on a side of the first circuit board 210. Therefore, one of the first circuit board 210 and the second circuit board 220 is not supported at the center and may be deflected easily. In order to overcome this problem, the inner bottom surface 111 further includes an auxiliary carrying platform 133 to cooperate with the first carrying platform 131 or the second carrying platform 132 to uniformly support the first circuit board 210 or the second circuit board 220.

In this embodiment, the first carrying platform 131 is disposed corresponding to the center of the first circuit board 210 in the longitudinal direction of the casing 100, and the auxiliary carrying platform 133 supports the second circuit board 220. The inner top surface 121 has an auxiliary holder block 143 protruded therefrom, and the second circuit board 220 is clamped between the auxiliary carrying platform 133 and the auxiliary holder block 143.

The configuration of the auxiliary carrying platform 133 is not limited to that of this disclosure only, the second carrying platform 132 may also be arranged corresponding to the center of the second circuit board 220 in the longitudinal direction of the casing 100, and the auxiliary carrying platform 133 supports the first circuit board 210, and the first circuit board 210 is clamped between the auxiliary carrying platform 133 and the auxiliary holder block 143.

The assembling method of the electrical connector in accordance with this disclosure includes the following steps.

Figure 2:
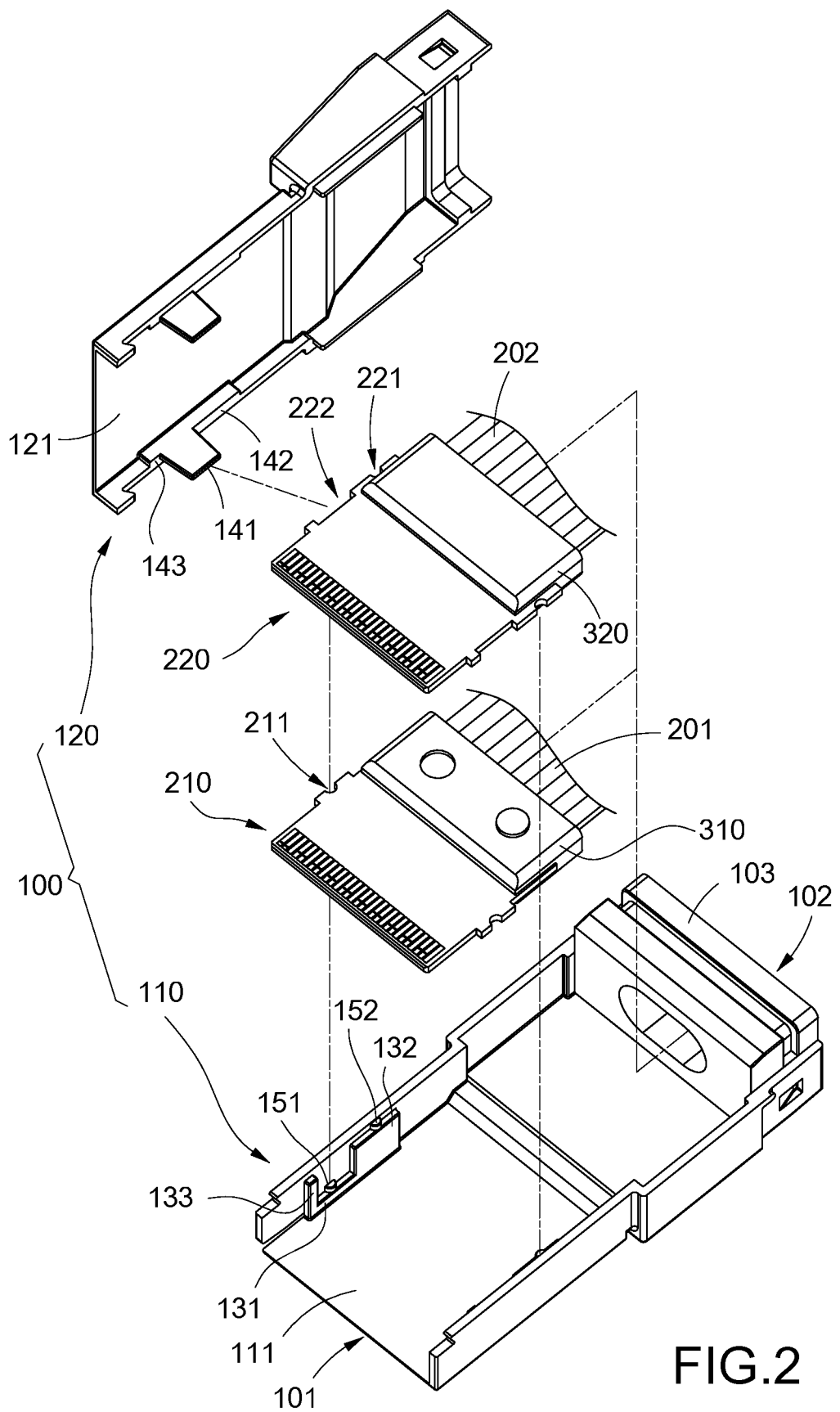
FIG. 2 is an exploded view of an electrical connector in accordance with some embodiments of this disclosure.
Figure 12:
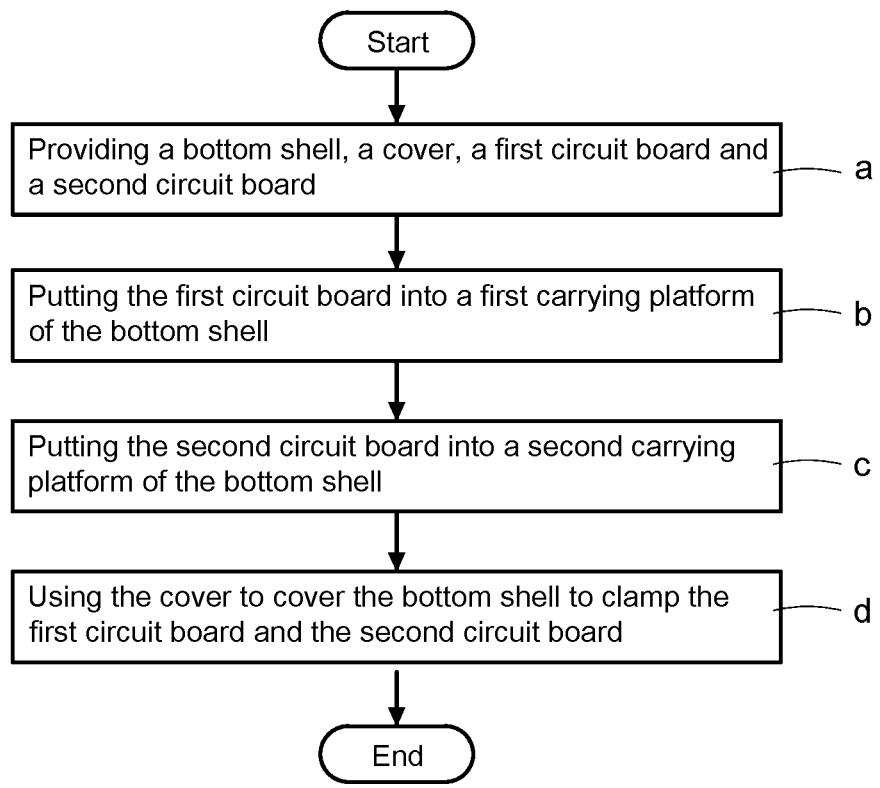
FIG. 12 is a flow chart of an assembling method of an electrical connector in accordance with some embodiments of this disclosure.

With reference to FIGS. 2 and 12 for step (a), a bottom shell 110, a cover 120, a first circuit board 210 and a second circuit board 220 are provided. The bottom shell 110 has an inner bottom surface 111 and an open top, and the inner bottom surface 111 has a first carrying platform 131 and a second carrying platform 132 protruded therefrom, and the cover 120 has an inner top surface 121, and the inner top surface 121 has a first holder block 141 and a second holder block 142, and the second circuit board 220 has an opening 222. The bottom shell 110 has a first positioning pin 151 and second positioning pin 152 protruded therefrom, and the first circuit board 210 has a first positioning notch 211 configured to be corresponding to the first positioning pin 151, and the second circuit board 220 has a second positioning notch 221 configured to be corresponding to the second positioning pin 152.

Figure 3:
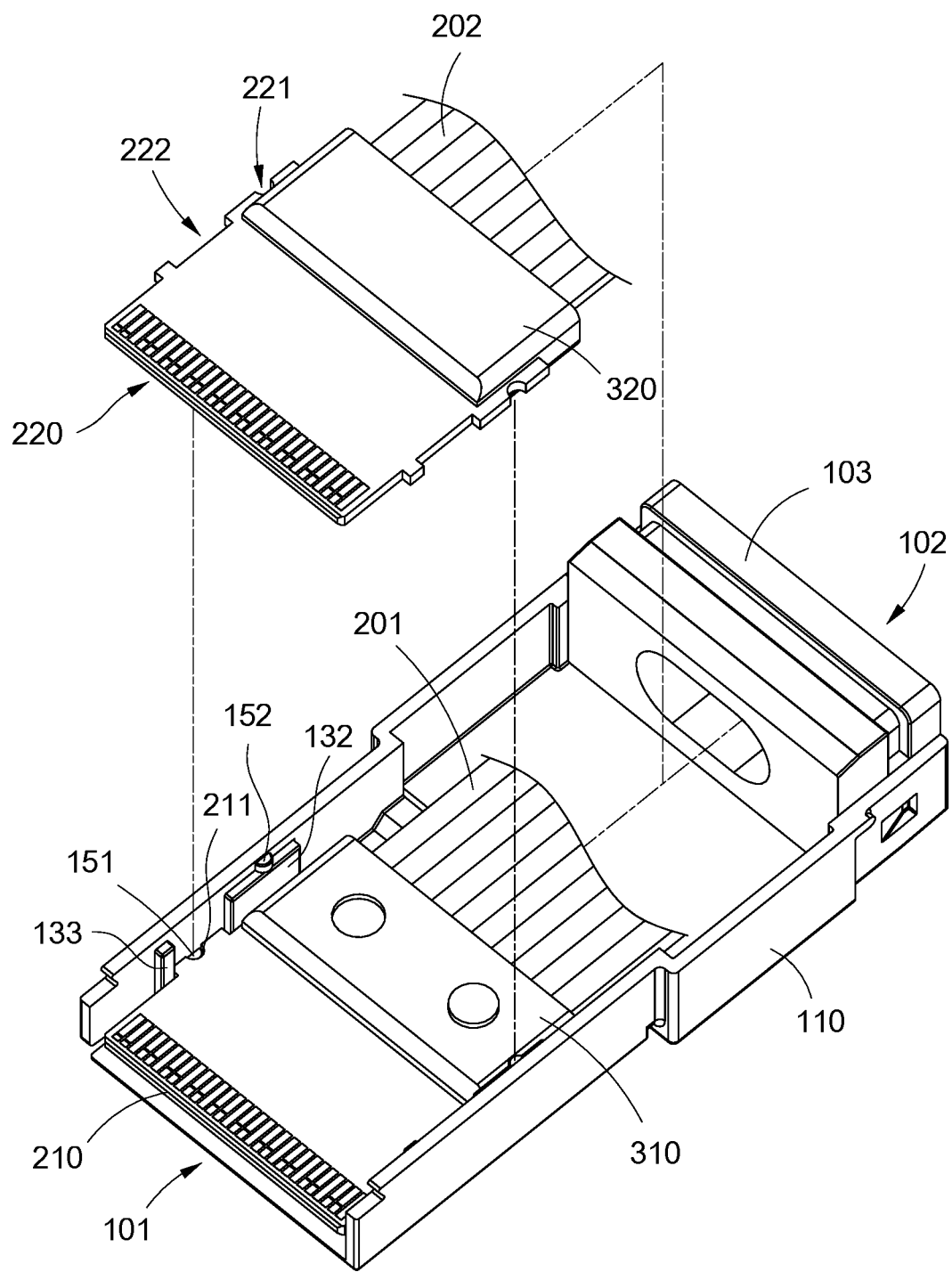
FIGS. 3 and 4 are schematic views showing each assembling step of an electrical connector in accordance with some embodiments of this disclosure.

With reference to FIGS. 2, 3 and 12 for step (b) carried out after step (a), the first circuit board 210 is put into the bottom shell 110 to be located on first carrying platform 131. Meanwhile, the first positioning pin 151 is plugged into the first positioning notch 211 to position the first circuit board 210.

Figure 4:
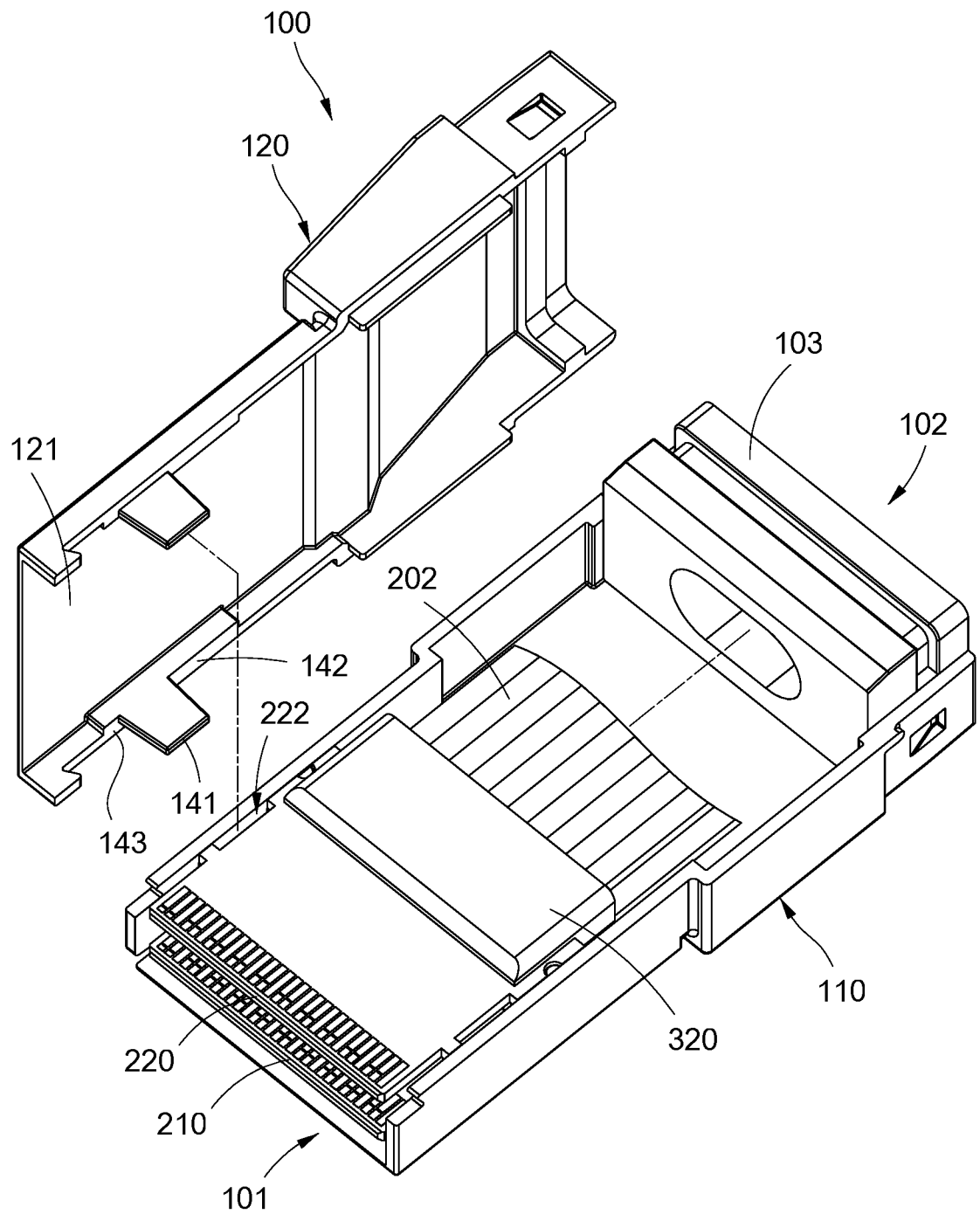

With reference to FIGS. 3, 4 and 12 for step (c) carried out after step (b), the second circuit board 220 is put into the bottom shell 110 to be located on the second carrying platform 132 and stacked on the first circuit board 210. Meanwhile, the second positioning pin 152 is plugged into the second positioning notch 221 to position the second circuit board 220. In some embodiments, the first circuit board 210 is embedded into a first insulation base 310 and the first insulation base 310 covers the connecting position of the lead wire 201 of the first circuit board 210, and the second circuit board 220 is embedded into a second insulation base 320 and the second insulation base 320 covers the connecting position of the lead wire 202 of the second circuit board 220. In step (c), the first insulation base 310 and the second insulation base 320 are engaged with each other.

Figure 5:
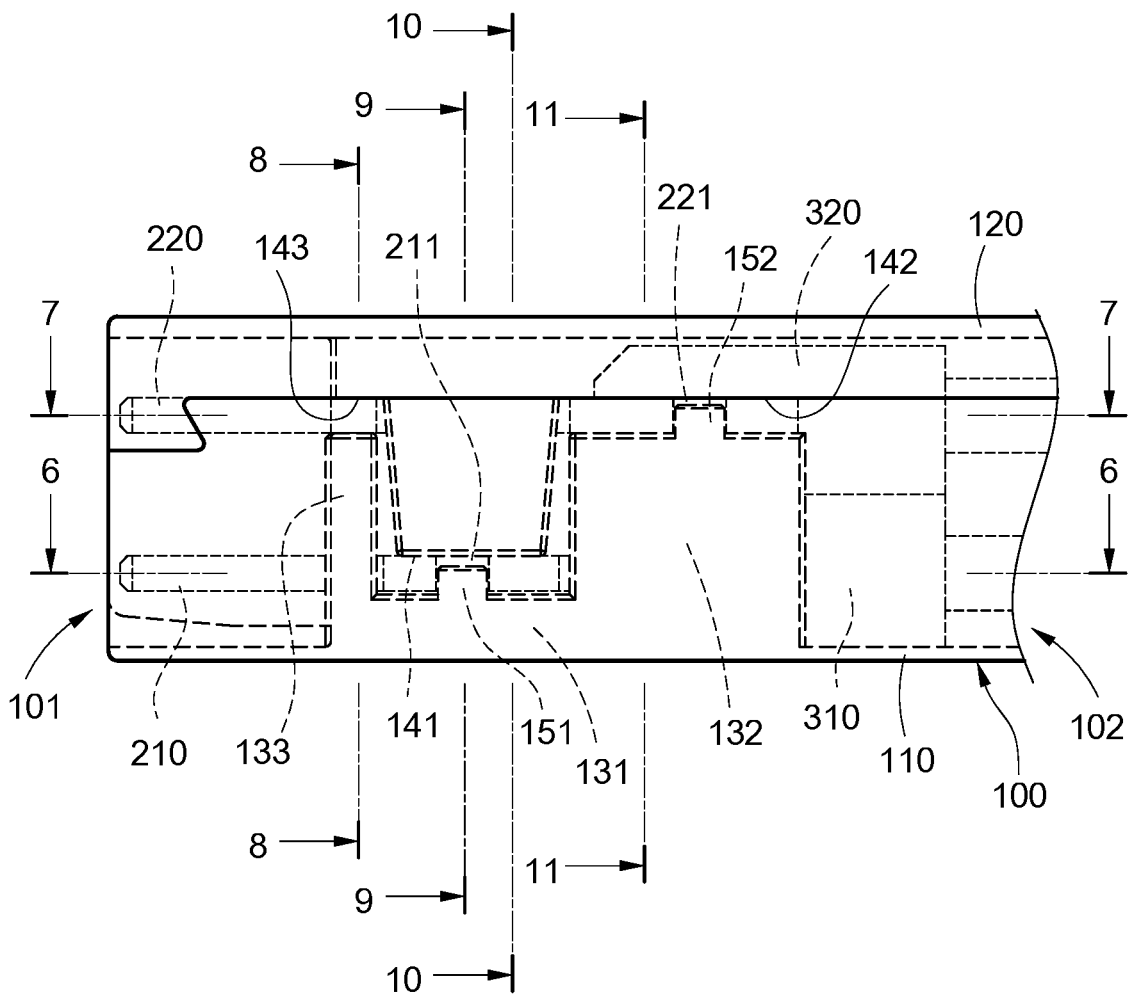
FIG. 5 is a perspective cross-sectional view of an electrical connector in accordance with some embodiments of this disclosure.
Figure 6:
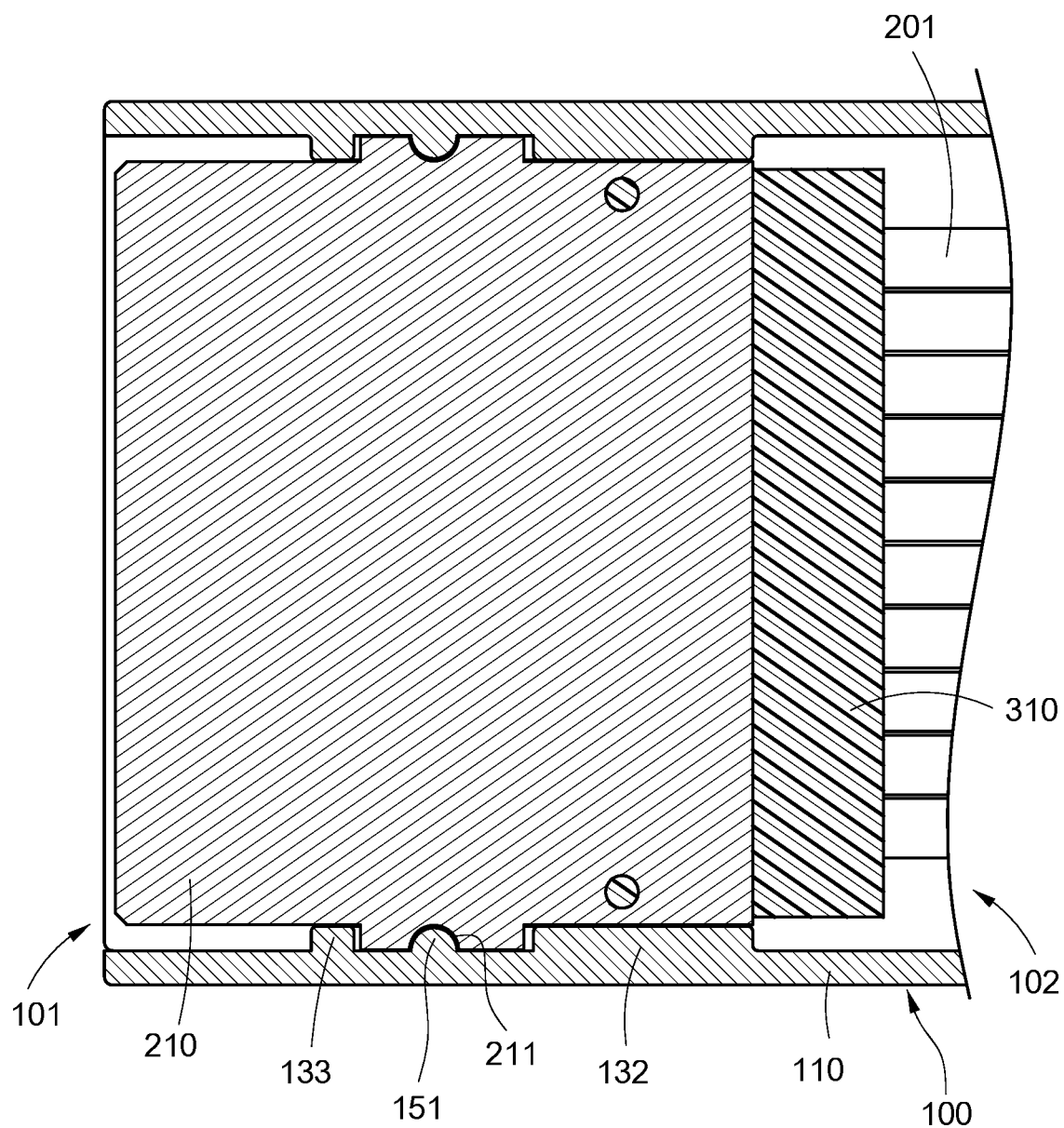
FIG. 6 is a longitudinal cross-sectional view of Section 6-6 of FIG. 5.
Figure 7:
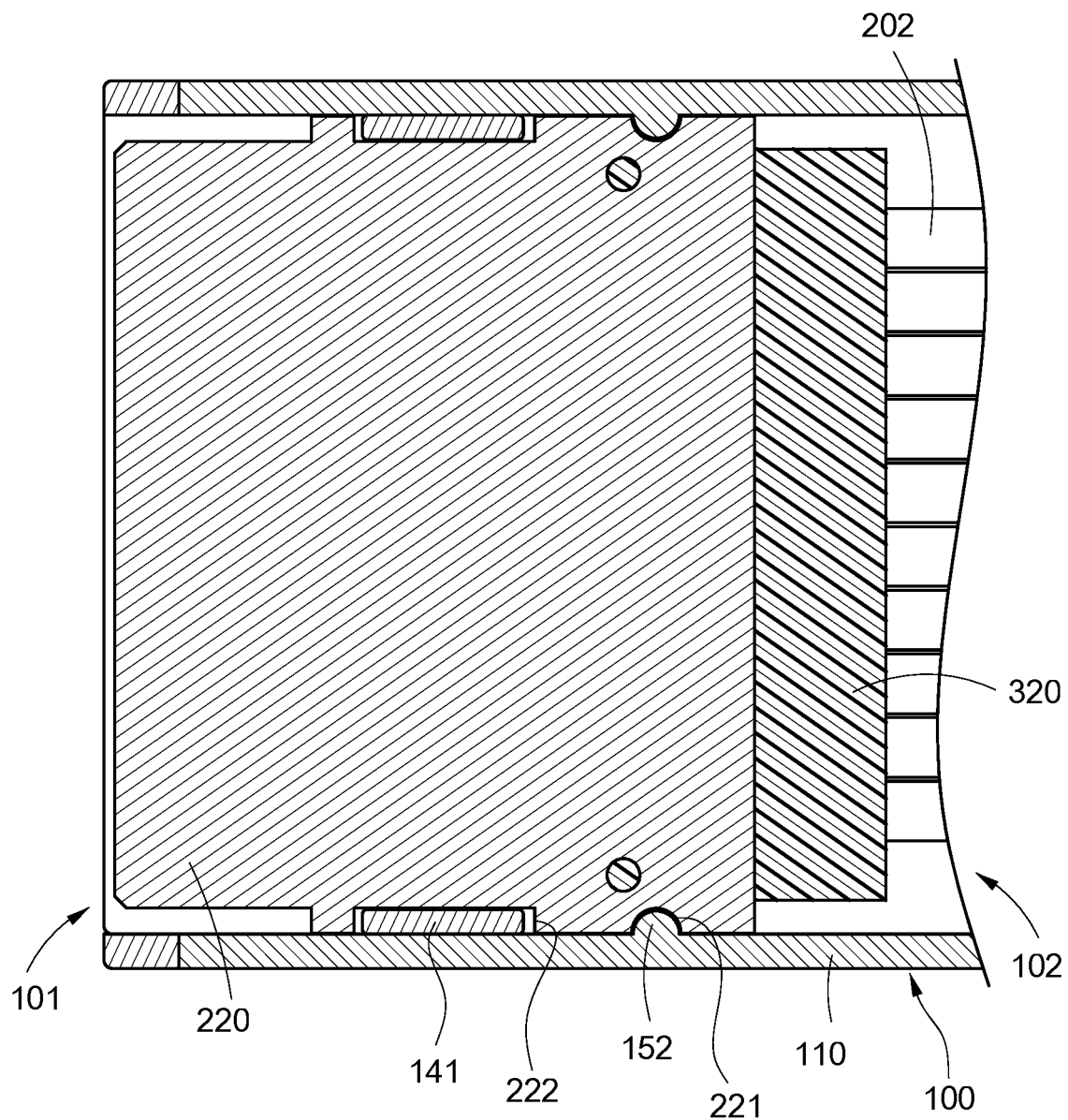
FIG. 7 is a longitudinal cross-sectional view of Section 7-7 of FIG. 5.
Figure 8:
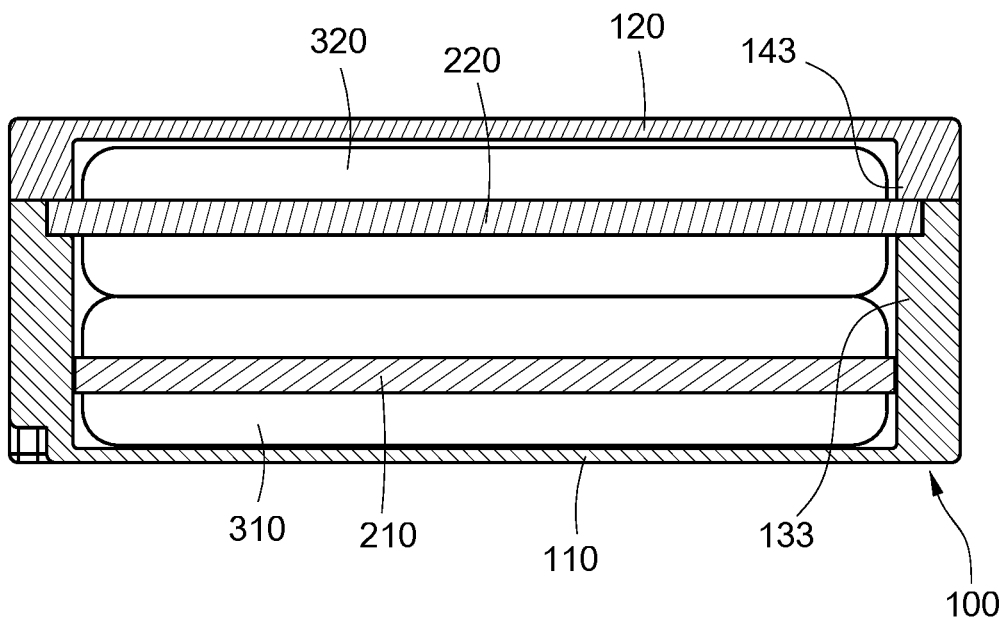
FIG. 8 is a longitudinal cross-sectional view of Section 8-8 of FIG. 5.
Figure 9:
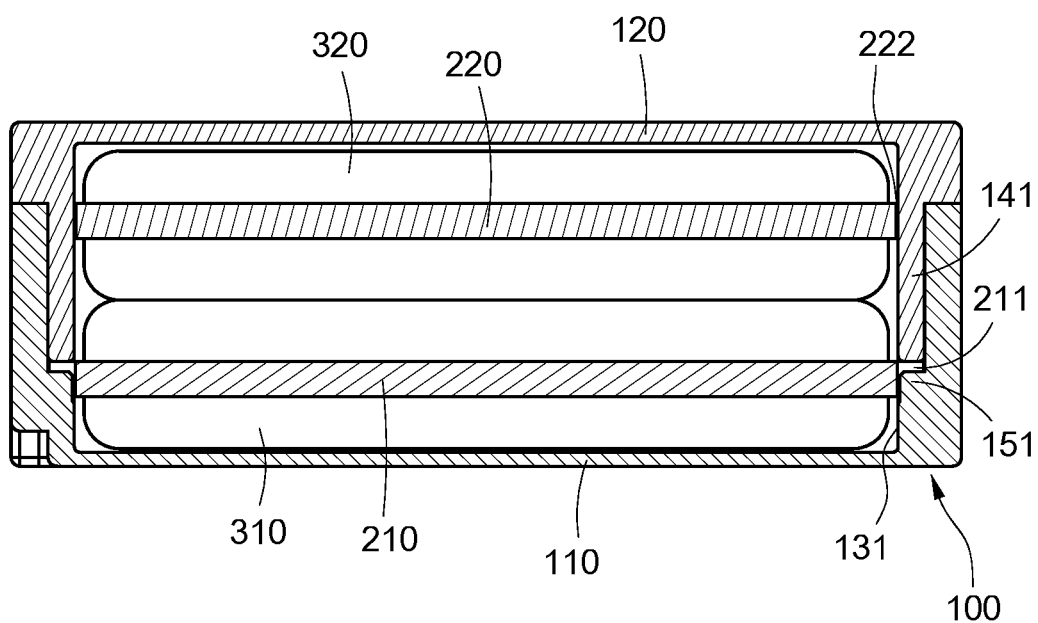
FIG. 9 is a transversal-cross-sectional view of Section 9-9 of FIG. 5.
Figure 10:
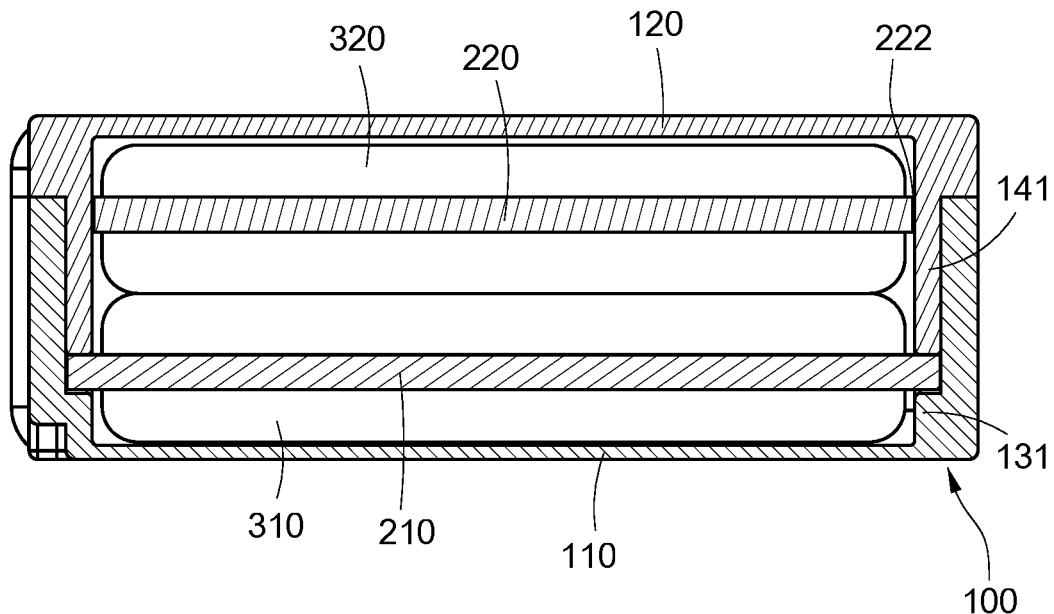
FIG. 10 is a transversal-cross-sectional view of Section 10-10 of FIG. 5.
Figure 11:
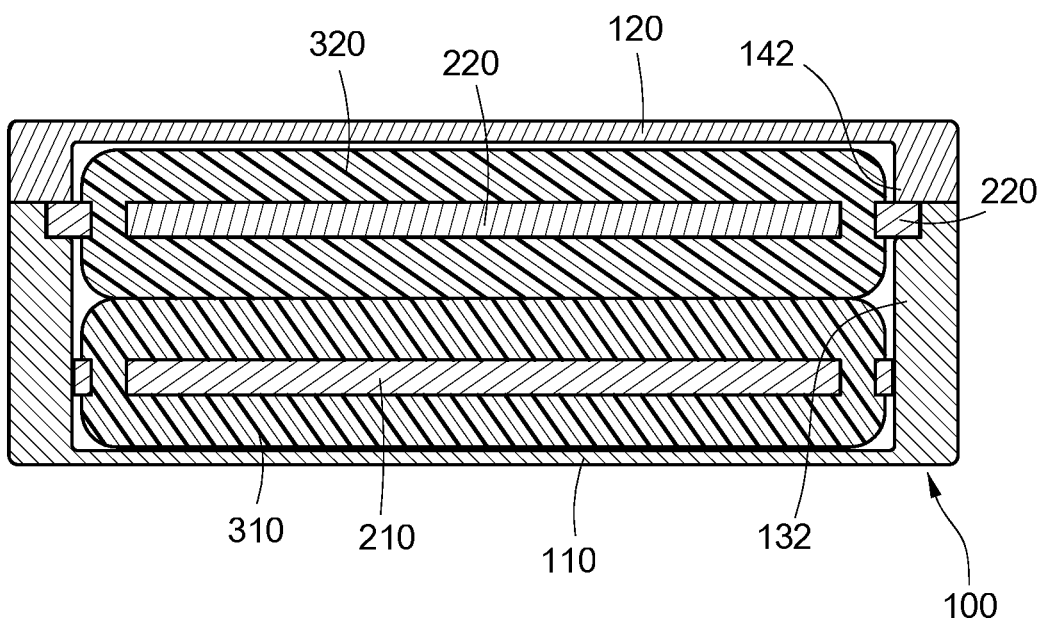
FIG. 11 is a transversal-cross-sectional view of Section 11-11 of FIG. 5.

With reference to FIGS. 4, 5 and 12 for step (d) carried out after step (c), the cover 120 is used to cover and close the top of the bottom shell 110, and the first holder block 141 passes through the opening 222, and the first circuit board 210 is clamped by the first carrying platform 131 and the first holder block 141, and the second circuit board 220 is clamped by the second carrying platform 132 and the second holder block 142.

In the electrical connector of this disclosure, both of the first carrying platform 131 and the second carrying platform 132 are disposed on the bottom shell 110, so as to facilitate assembling the first circuit board 210 and the second circuit board 220 to the bottom shell 110 one by one, without the need of positioning the first circuit board 210 and the second circuit board 220 relative to each other. The second circuit board 220 has an opening 222 for the first holder block 141 to pass, so that when the cover 120 is installed, the first circuit board 210 and the second circuit board 220 are fixed at the same time.

While this disclosure has been described by means of specific embodiments, numerous modifications and variations could be made thereto by those skilled in the art without departing from the scope and spirit of this disclosure set forth in the claims.

What is claimed is:

1. An electrical connector, comprising:
  a casing, comprising a bottom shell and a cover, the bottom shell comprising an inner bottom surface and a top in an open manner, and a first carrying platform and a second carrying platform disposed protrusively on the inner bottom surface, and the cover comprising an inner top surface, and the cover covering and closing the top of the bottom shell for the inner top surface and the inner bottom surface to be arranged opposite to each other, and a first holder block and a second holder block disposed protrusively on the inner top surface;
  a first circuit board, carried on the first carrying platform and clamped between the first carrying platform and the first holder block; and
  a second circuit board, carried on the second carrying platform, stacked on the first circuit board, and clamped between the second carrying platform and the second holder block,
  wherein, the second circuit board comprises an opening, and the first holder block passes through the opening;
  wherein the bottom shell comprises a first positioning pin disposed protrusively thereon, and the first circuit board comprises a first positioning notch, and the first positioning pin is inserted in the first positioning notch;
  wherein the first positioning pin is disposed on a top of the first carrying platform.

2. The electrical connector according to claim 1, wherein an auxiliary carrying platform is disposed protrusively on the inner bottom surface, and the casing is in a rectangular shape, and the first carrying platform is disposed corresponding to a center of the first circuit board in a longitudinal direction of the casing, and the auxiliary carrying platform supports the second circuit board.

3. The electrical connector according to claim 2, wherein an auxiliary holder block is disposed protrusively on the inner top surface, and the second circuit board is clamped between the auxiliary carrying platform and the auxiliary holder block.

4. The electrical connector according to claim 1, wherein an auxiliary carrying platform is disposed protrusively on the inner bottom surface, and the casing is in a rectangular shape, and the second carrying platform is disposed corresponding to a center of the second circuit board in a longitudinal direction of the casing, and the auxiliary carrying platform supports the first circuit board.

5. The electrical connector according to claim 4, wherein an auxiliary holder block is disposed protrusively on the inner top surface, and the first circuit board is clamped between the auxiliary carrying platform and the auxiliary holder block.

6. The electrical connector according to claim 1, further comprising a first insulation base and a second insulation base, and the first circuit board embedded in the first insulation base, and the second circuit board embedded in the second insulation base, and the first insulation base and the second insulation base engaged with each other.

7. An assembling method of an electrical connector, the method comprising:
(a) providing a bottom shell, a cover, a first circuit board and a second circuit board, wherein the bottom shell comprises an inner bottom surface and a top in an open manner, and a first carrying platform and a second carrying platform are disposed protrusively on the inner bottom surface, and the cover comprises an inner top surface, and a first holder block and a second holder block are disposed protrusively on the inner top surface, and the second circuit board comprises an opening;
wherein the bottom shell comprises a first positioning pin disposed protrusively thereon, and the first circuit board comprises a first positioning notch, and the first positioning pin is disposed on a top of the first carrying platform;
wherein the bottom shell comprises a second positioning pin disposed protrusively thereon, and the second circuit board comprises a second positioning notch, and wherein the second positioning pin is disposed on a top of the second carrying platform;
(b) putting the first circuit board into the bottom shell to be located on the first carrying platform and inserting the first positioning pin in the first positioning notch;
(c) putting the second circuit board into the bottom shell to be located on the second carrying platform and stacked on the first circuit board and inserting the second positioning pin in the second positioning notch; and
(d) using the cover to cover and close the top of the bottom shell, and passing the first holder block through the opening to clamp the first circuit board by the first carrying platform and the first holder block and clamp the second circuit board by the second carrying platform and the second holder block.

8. The assembling method according to claim 7, wherein the bottom shell comprises a first positioning pin disposed protrusively thereon, and the first circuit board comprises a first positioning notch, and the (b) further comprises: inserting the first positioning pin into the first positioning notch to position the first circuit board.

9. The method of assembling an electrical connector according to claim 8, wherein the bottom shell comprises a second positioning pin disposed protrusively thereon, and the second circuit board comprises a second positioning notch, and the (c) further comprises: inserting the second positioning pin into the second positioning notch to position the second circuit board.

10. An electrical connector, comprising:
a casing, comprising a bottom shell and a cover, the bottom shell comprising an inner bottom surface and a top in an open manner, and a first carrying platform and a second carrying platform disposed protrusively on the inner bottom surface, and the cover comprising an inner top surface, and the cover covering and closing the top of the bottom shell for the inner top surface and the inner bottom surface to be arranged opposite to each other, and a first holder block and a second holder block disposed protrusively on the inner top surface;
a first circuit board, carried on the first carrying platform and clamped between the first carrying platform and the first holder block; and
a second circuit board, carried on the second carrying platform, stacked on the first circuit board, and clamped between the second carrying platform and the second holder block,
wherein, the second circuit board comprises an opening, and the first holder block passes through the opening,
wherein the bottom shell comprises a second positioning pin disposed protrusively thereon, and the second circuit board comprises a second positioning notch, and the second positioning pin is inserted in the second positioning notch,
wherein the second positioning pin is disposed on a top of the second carrying platform.

11. The electrical connector according to claim 10, wherein an auxiliary carrying platform is disposed protrusively on the inner bottom surface, and the casing is in a rectangular shape, and the first carrying platform is disposed corresponding to a center of the first circuit board in a longitudinal direction of the casing, and the auxiliary carrying platform supports the second circuit board.

12. The electrical connector according to claim 11, wherein an auxiliary holder block is disposed protrusively on the inner top surface, and the second circuit board is clamped between the auxiliary carrying platform and the auxiliary holder block.

13. The electrical connector according to claim 10, wherein an auxiliary carrying platform is disposed protrusively on the inner bottom surface, and the casing is in a rectangular shape, and the second carrying platform is disposed corresponding to a center of the second circuit board in a longitudinal direction of the casing, and the auxiliary carrying platform supports the first circuit board.

14. The electrical connector according to claim 13, wherein an auxiliary holder block is disposed protrusively on the inner top surface, and the first circuit board is clamped between the auxiliary carrying platform and the auxiliary holder block.

15. The electrical connector according to claim 10, further comprising a first insulation base and a second insulation base, and the first circuit board embedded in the first insulation base, and the second circuit board embedded in the second insulation base, and the first insulation base and the second insulation base engaged with each other.

* * * * *